United States Patent
Bliven et al.

(10) Patent No.: US 6,557,202 B1
(45) Date of Patent: May 6, 2003

(54) WAFER SCRUBBING BRUSH CORE HAVING AN INTERNAL MOTOR AND METHOD OF MAKING THE SAME

(75) Inventors: Brian M. Bliven, San Jose, CA (US); Douglas G. Gardner, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/454,699

(22) Filed: Dec. 3, 1999

(51) Int. Cl.⁷ ................................................. B08B 11/00
(52) U.S. Cl. ............................ 15/77; 15/21.1; 15/88.3; 15/102
(58) Field of Search .................. 15/21.1, 77, 88.3, 15/88.4, 102

(56) References Cited

U.S. PATENT DOCUMENTS

| | | | |
|---|---|---|---|
| 2,563,048 A | 8/1951 | Liebelt et al. | |
| 2,563,049 A | 8/1951 | Liebelt et al. | |
| 2,565,743 A | 8/1951 | Schaefer | |
| 2,606,334 A | 8/1952 | Vaden et al. | |
| 2,889,696 A | 6/1959 | Lynch | |
| 3,636,580 A | * 1/1972 | Woodworth | |
| 3,649,980 A | * 3/1972 | Ebeling | |
| 3,711,261 A | * 1/1973 | Burns | |
| 3,826,581 A | 7/1974 | Henderson | |
| 3,907,257 A | * 9/1975 | Drzewiecki | |
| 4,461,052 A | 7/1984 | Mostul | |
| 4,476,601 A | 10/1984 | Oka | |
| 4,569,695 A | 2/1986 | Yamashita et al. | |
| 5,081,733 A | 1/1992 | Kudo | |
| 5,419,003 A | * 5/1995 | Tollasepp | |
| 5,518,552 A | 5/1996 | Tanoue et al. | |
| 5,639,311 A | 6/1997 | Holley et al. | |
| 5,745,945 A | 5/1998 | Manfredi et al. | |
| 5,806,126 A | 9/1998 | de Larios et al. | |
| 5,875,507 A | 3/1999 | Stephens et al. | |
| 6,247,197 B1 | * 6/2001 | Vail | |

FOREIGN PATENT DOCUMENTS

| | | |
|---|---|---|
| DE | 448290 | 8/1927 |
| DE | 674645 | 4/1939 |
| FR | 1035235 | 4/1953 |
| JP | 59-193029 | 11/1984 |
| SD | 271795 | 11/1967 |

* cited by examiner

Primary Examiner—Randall E. Chin
(74) Attorney, Agent, or Firm—Martine & Penilla, LLP

(57) ABSTRACT

A brush core and method of making a brush core are provided. The brush core is configured to be implemented in substrate preparation systems. The brush core is connected between a first end and a second end of a non-rotating shaft. A motor is contained within the brush core for rotating the brush core around the non-rotating shaft. The first end and the second end are each capable of being adjusted to calibrate and position the brush core. The calibrated position of the brush core can be set to compensate for a skewed substrate, or to achieve a desired pressure application profile over the substrate.

16 Claims, 7 Drawing Sheets

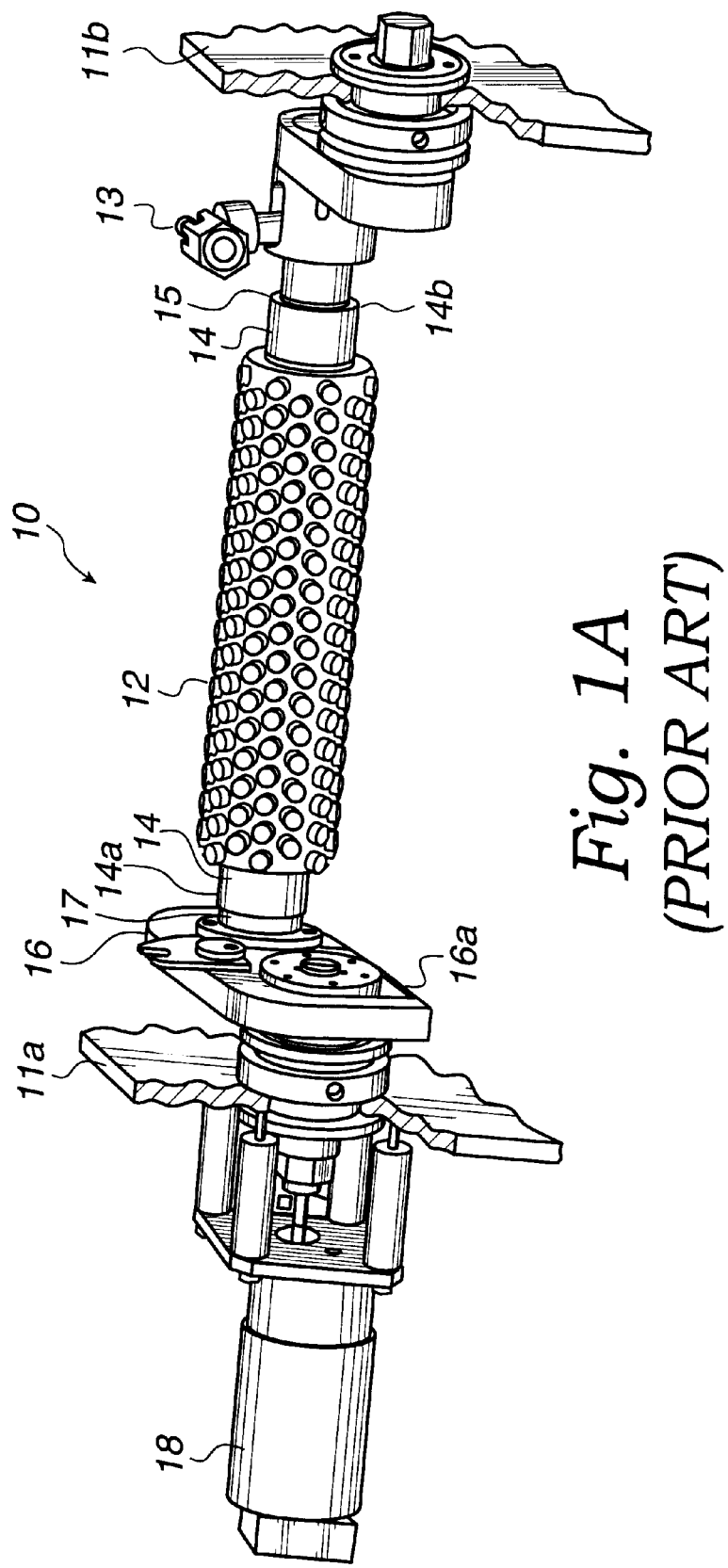

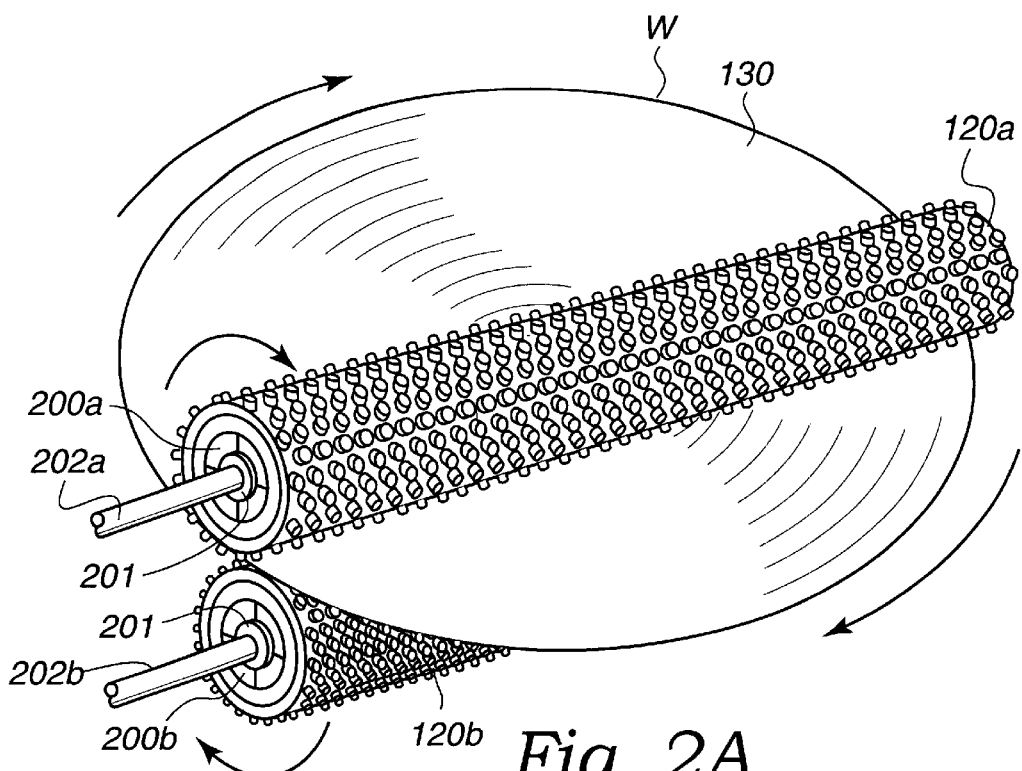
Fig. 2A
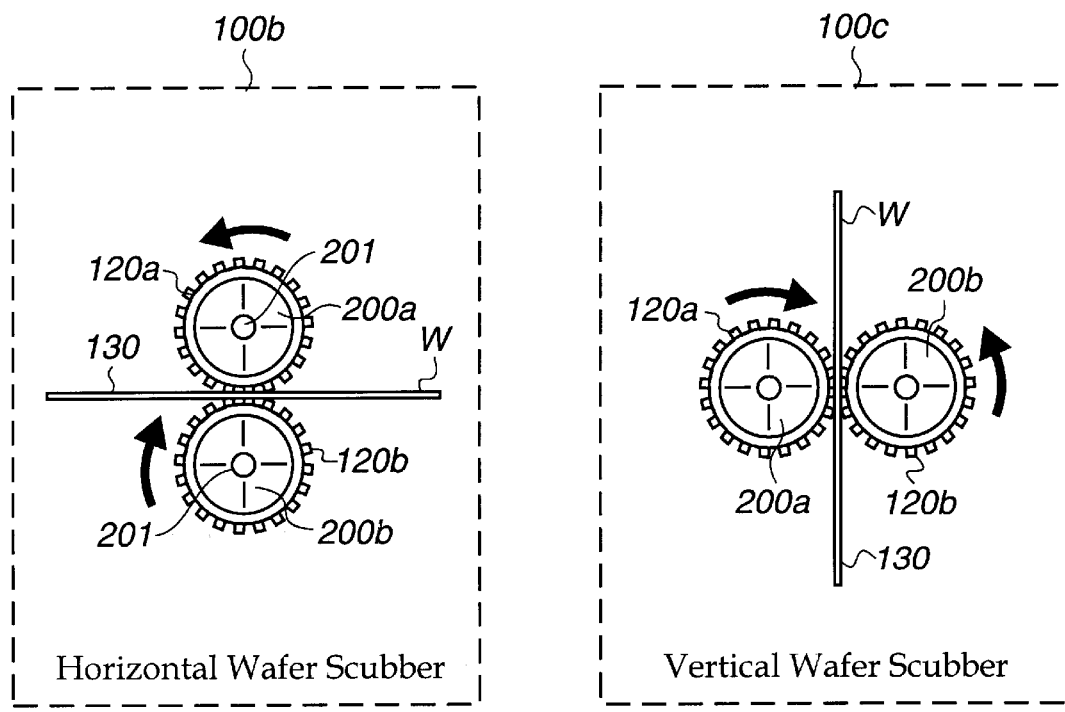
Horizontal Wafer Scubber
Fig. 2B
Vertical Wafer Scubber
Fig. 2C

US 6,557,202 B1

WAFER SCRUBBING BRUSH CORE HAVING AN INTERNAL MOTOR AND METHOD OF MAKING THE SAME

BACKGROUND OF THE INVENTION

1. Field of the Invention

This invention relates generally to substrate fabrication, and more particularly to semiconductor wafer preparation equipment.

2. Description of the Related Art

As is well known, semiconductor devices are fabricated from semiconductor wafers, which are subjected to numerous processing operations. These operations include, for example, impurity implants, gate oxide generation, inter-metal oxide depositions, metallization depositions, photolithography pattering, etching operations, chemical mechanical polishing (CMP), etc. Although these processes are performed in ultra-clean environments, the very nature of many of the process operations is to blame for the generation of surface particles and residues. For instance, when CMP operations are performed, a film of particles and/or metal contaminants are commonly left behind.

Because surface particles can detrimentally impact the performance of an integrated circuit device, wafer cleaning operations have become a standard procedural requirement after certain process steps. Although cleaning operations are rather procedural, the equipment and chemicals implemented to perform the actual cleaning are highly specialized. This specialization is important because each wafer, being at different stages of fabrication, represents a significant investment in terms of raw materials, equipment fabrication time, and associated research and development.

To perform the cleaning operations in an automated manner, fabrication labs employ cleaning systems. The cleaning systems typically include one or more brush stations in which wafers are scrubbed. Each brush station includes a pair of brushes, such that each brush scrubs a respective side of a wafer. To enhance the cleaning ability of such brush stations, it is common practice to deliver cleaning fluids through the brush (TTB). TTB fluid delivery is accomplished by implementing brush cores that have a plurality of holes that allow fluids being fed into the center of the brush core at a particular pressure to be released into an outer brush surface. The outer brush surface is made out of a very porous and soft material so that direct contact with the delicate surface of a wafer does not cause scratches or other damage. Typically, the outer brush surface is a made out of polyvinyl alcohol (PVA) foam. Although, other materials such as nylon, mohair or a mandrel wrapped with a polishing pad material can be used.

As semiconductor design and performance requirements continue to increase, cleaning engineers are also challenged to improve their associated processes. To meet these demands, the same cleaning equipment is now being used to perform operations other than basic de-ionized (DI) water cleaning. Such operations include the application of sophisticated chemicals TTB to remove particulates and/or to etch precision amounts of materials from the surfaces of a wafer. Although much research and development goes into the design of cleaning and etching chemicals, the effectiveness of such chemicals is only as good as their delivery and application onto the surface of a wafer.

In a conventional wafer preparation system, in which wafer scrubbing is performed, the system typically connects an end of each brush to its own drive train and external motor to enable rotation of the brush over a wafer. FIG. 1 illustrates a prior art implementation 10 in which a single brush 12 is mounted on a brush core 14. The brush core 14 has a first end 14a that is connected to a drive train 16 and a second end that is connected to a wall 11b. The drive train 16 typically has a number of gears 16a that enable a motor 18 to rotationally drive the brush 12 at a desired rate. The drive train 16 is typically contained inside a wall 11a and proximate to the first end of the brush core 14a. The motor 18 is thus coupled to the drive train through the wall 11a. The brush core 14 is a core that can allow fluids to be input through a fluid input 13.

A problem with this conventional implementation is that the brush core 14 is required to move in relation to the walls 11a and 11b while maintaining the drive train 16 and the motor 18 connections so they can function. Because the brush core 14 needs to pivot with respect to the walls 11a and 11b, the brush core 14 experiences some unstable movement during operation. For example, slider couplers 15 and 17 are designed with a level of tolerance to enable the brush core 14 to be decouple and allow the brush 12 to be changed or serviced. This tolerance therefore causes the unstable movement that is known to cause an improper application of chemicals TTB or application of pressure onto the wafer being cleaned, etched, or buffed. The unstable movement is also referred to uncontrollable brush skewing. However, the goal of this conventional design is to maintain the brush core 14 stable with respect to the drive train 16 and the walls. It is also a goal to prevent a skewed brush from contacting an entering water, or have a brush that contacts the wafer at a skewed orientation because the wafer itself is entering skewed. Although attempts are constantly being made to improve the stability of the brush core 14 during operation, the brush core 14 nonetheless needs to have a degree of free movement (e.g., non-controllable brush skewing) to enable the slide couplers 15 and 17 of the drive train 16 to work properly.

Because traditional cleaning typically only included the application of DI water and/or ammonia based chemicals, the uneven application of a brush and thus the fluids through the brush core did not in many cases detrimentally impact cleaning performance. However, because most cleaning systems are now required to also apply engineered chemicals, such as hydrofluoric acid (HF) containing etch chemicals, any uneven application of the brush and chemicals will have a sever impact on the wafer being processed. For instance, if more HF is applied to one part of the wafer and less is applied to another part of the wafer, the surface of the processed wafer may exhibit performance impacting etch variations due to experienced chemical concentration variations.

In view of the foregoing, there is a need for improved brush designs that enable the controlled and programmable application of the brush onto the surface of a wafer during wafer preparation.

SUMMARY OF THE INVENTION

Broadly speaking, the present invention fills these needs by providing a brush core having an internal motor. Removing the external drive train allows each end of the brush core to be independently position calibrated to achieve the desired contact or pressure with a substrate during substrate preparation. The substrate can be any substrate that may need to undergo a scrubbing operation to complete a cleaning operation, etching operation, buffing operation or other preparation. For instance, the substrate can be a semiconductor wafer, a hard drive disk, or any other type of workpiece needing preparation. It should be appreciated that the present invention can be implemented in numerous ways, including as a process, an apparatus, a system, a device, or a method. Several inventive embodiments of the present invention are described below.

In one embodiment, a brush core for use in substrate preparation is disclosed. The brush core includes a cylindrical inner motor case that has a first diameter. A cylindrical brush core shell having a second diameter that is greater than the first diameter is also provided. A separation between the first diameter and the second diameter defines a fluid distribution channel of the brush core. A motor is encapsulated within the cylindrical inner motor case. Motor end caps are configured to seal the motor within the cylindrical inner motor case, and a bore is defined in each of the motor end caps. A shaft is positioned through the motor, penetrating both end caps, and a first end of the shaft has a fluid inlet for providing a fluid to the fluid distribution channel. The shaft also has a second end that is directly opposite the first end of the shaft. Because the motor and associated drive train are contained within the brush core, both the first end and the end of the shaft can be positioned independently to achieve the desired brush core skew. In this embodiment, if desired, the shaft can be controlled to achieve a desired pressure contact zone over the substrate being prepared. The positioning is capable of being performed by way of position controllers that can be computer programmed, manually adjusted, or automatically adjusted depending upon a detected skew condition of a substrate. In this manner, if desired, the brush can make equal contact with the surface of the substrate along the entire length of the brush.

In another embodiment, a brush core is disclosed. The brush core is connected between a first end and a second end of a non-rotating shaft. A motor is contained within the brush core for rotating the brush core around the non-rotating shaft. The first end and the second end are each capable of being adjusted to calibrate and position the brush core. The calibrated position of the brush core can be set to compensate for a skewed substrate, or to achieve a desired pressure application profile over the substrate.

In yet a further embodiment, a method of making a brush core for use in substrate preparation is disclosed. The method includes: (a) providing a motor; (b) forming an internal motor case for containing the motor; (c) forming a brush core shell around the internal motor case, the brush core shell is separated from the internal motor case, the separation defines a fluid distribution channel, and the brush core shell has a plurality of holes that define paths out of the fluid distribution channel; (d) forming motor end caps for closing a first end and a second end of the brush core shell and the internal motor case; and (e) providing a shaft that is configured to be inserted into a bore of the motor end caps, and the shaft has a fluid inlet for providing a fluid flow to the fluid distribution channel and out of the plurality of holes. At the other end of the shaft, electrical connections can be fed to the motor.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1A provides a diagram of at prior art brush and brush core coupled to an external drive train and motor.

FIG. 2A illustrates a simplified three-dimensional diagram of a pair of brushes scrubbing a top surface and a bottom surface of a wafer, in accordance with one embodiment of the present invention.

FIGS. 2B and 2C illustrate cross-sectional views of two different orientations for scrubbing a wafer, in accordance with one embodiment of the present invention.

DETAILED DESCRIPTION OF THE PREFERRED EMBODIMENTS

An invention is described for a brush core for use in preparing substrates. The substrate can be any substrate that may need to undergo preparation. The preparation can be performed in any number of preparation units. The preparation units can be referred to as substrate scrubbers, substrate cleaners, substrate buffers, and the like. The preparation units can be part of a larger integrated system or can be a standalone unit. The preparation operation can be one of or a combination of cleaning operations, etching operations, buffing operations, and other known preparation operations. It will be obvious, however, to one skilled in the art, that the present invention may be practiced without some or all of these specific details. In other instances, well known process operations have not been described in detail in order not to unnecessarily obscure the present invention.

The following description provided with reference to FIGS. 1B through 2C will introduce exemplary preparation units and their respective orientations in which substrates can be processed. Exemplary brush core designs will then be described with reference to FIGS. 3 through 5. As will be described in greater detail below, the exemplary brush core designs of the present invention preferably have an internal motor to enable precision control of each brush core end during processing.

Figure 1B:
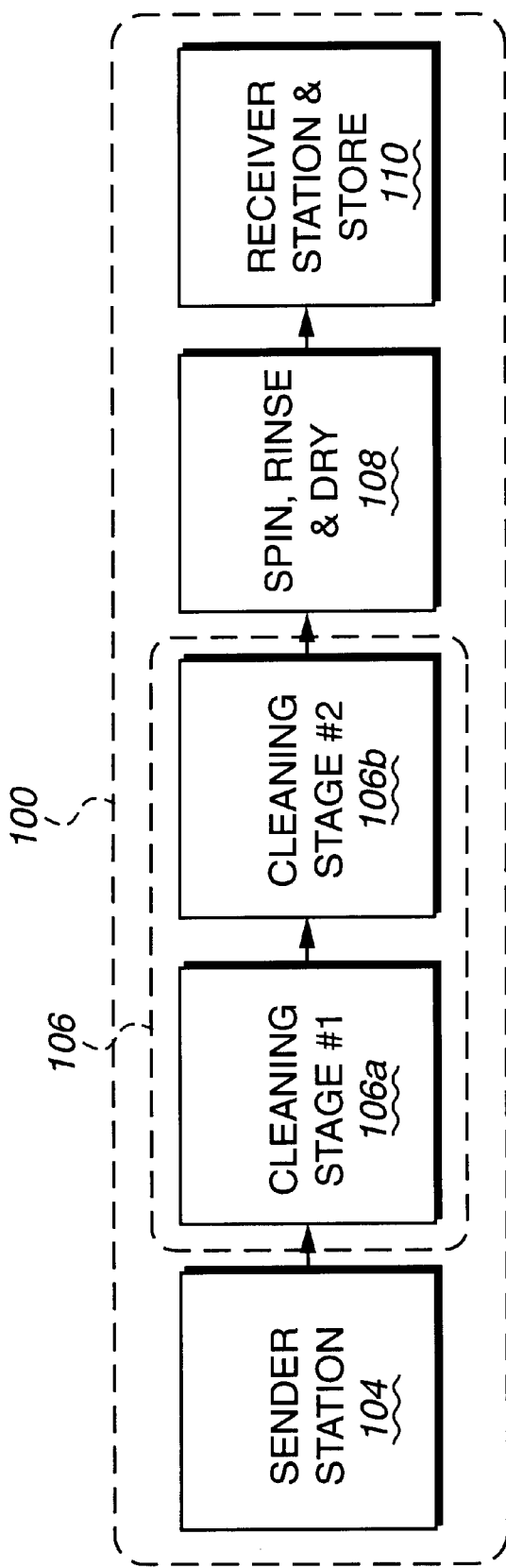
FIG. 1B shows a wafer cleaning station of the present invention that may be controlled in an automated way by a cleaning control station.
Figure 1B:
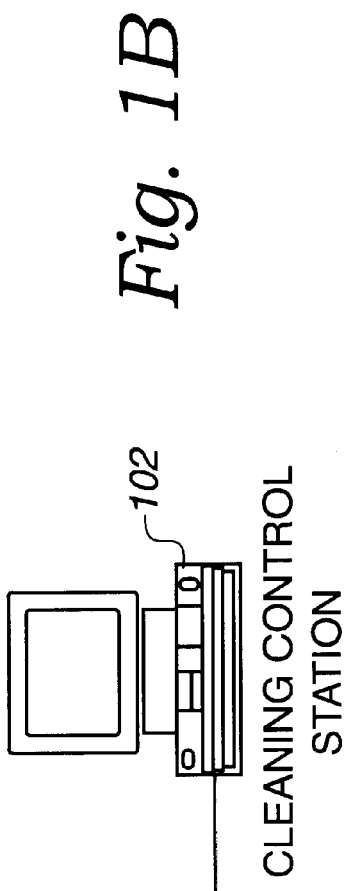

FIG. 1B shows a wafer cleaning station 100 of the present invention that may be controlled in an automated way by a cleaning control station 102. The wafer cleaning station 100 includes a sender station 104, a cleaning stage 106, a spin-rinse and dry (SRD) station 108, and a receiver station 110. It should be understood that cleaning systems can be used to carry out different kinds of substrate preparation operations, such as, cleaning, etching, buffing, and the like. With this in mind, as a broad overview of a cleaning process, semiconductor wafers are initially placed into the sender station 104. The sender station 104 then delivers wafers (one-at-a-time) to the cleaning stage 106. In one embodiment, the cleaning stage 106 is divided into a first cleaning stage 106a and a second cleaning stage 106b, although having just one cleaning stage 106 will also work. After passing through the cleaning stage 106, the wafer is passed through an exit spray in order to remove the cleaning fluids and any contaminants. The SRD station 108 dries the wafer and then it is delivered to the receiver station 110 for temporary storage.

Figure 1C:
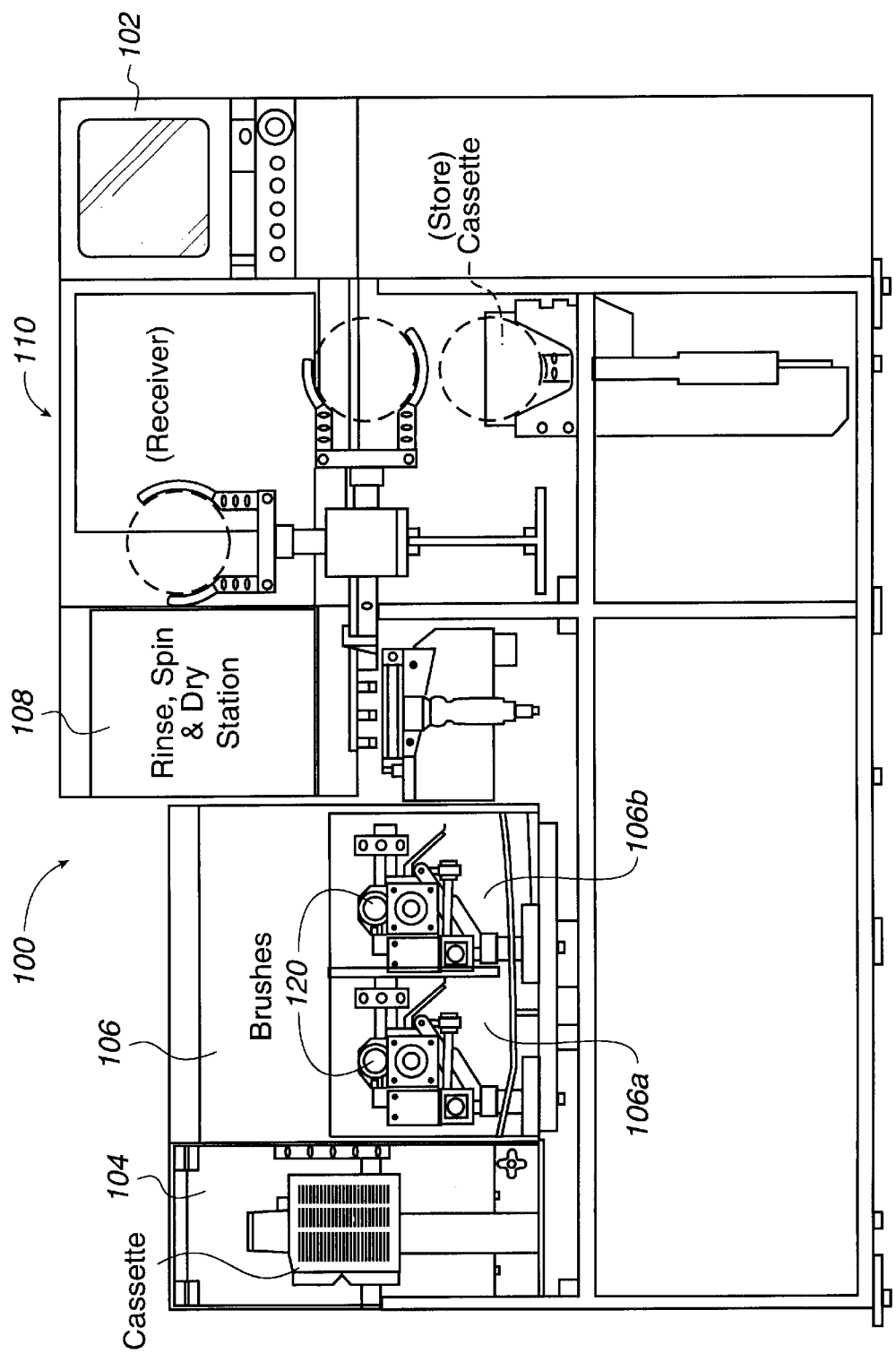
FIG. 1C shows a more detailed schematic of an exemplary wafer cleaning station, in accordance with one embodiment of the present invention.

FIG. 1C shows a more detailed schematic of an exemplary wafer cleaning station 100. Both the sender station 104 and the receiving station 110 are preferably adapted to receive a cassette containing a number of wafers. The first and second cleaning stages 106a and 106b preferably include a set of PVA brushes 120 that are very soft and porous. As will be described below, the brushes 120 are mounted on brush cores 200 of the present invention. As is well known, the brushes 120 are capable of scrubbing the wafer without damaging the delicate surface. The brushes 120 can also be replaced with a buffing material when the system is implemented in substrate buffing operations.

FIG. 2A illustrates a simplified three-dimensional diagram of a pair of brushes 120a and 120b for scrubbing a top Surface and a bottom surface, respectively, of a wafer 130. Typically, the wafer 130 is caused to rotate in a particular direction while the brushes 120 rotate around an axis of rotation and the surface of the brushes 120 are in contact with the surfaces of the wafer 130. The brushes 120a and 120b are mounted on brush cores 200a and 200b. The brush cores 200 are configured to have a shaft 201 which has a fluid inlet 202. The fluid inlet 202 will thus supply the desired fluids into the brush core 200. The brush core 200 preferably has a plurality of holes that will allow the fluids to uniformly exit the brush core 200 and evenly supply the desired fluid to the brush 120.

FIGS. 2B and 2C illustrate cross-sectional views of two different orientations for scrubbing a wafer 130, in accordance with one embodiment of the present invention. As shown in FIG. 2B, the wafer is held horizontally while a top brush 120a scrubs the top surface of the wafer 130, and a bottom brush 120b scrubs the bottom surface of the wafer 130. As mentioned above, the wafer 130 is configured to rotate (using rollers not shown) at the same time that the brushes 120 rotate to ensure that the entire surface area of the wafer is properly scrubbed to remove contaminants, etch the surface to a desired degree, or buff the surface. Thus, FIG. 2B illustrates a horizontal wafer scrubber 100b.

In contrast, FIG. 2C illustrates a vertical wafer scrubber 100c in which the wafer 130 is scrubbed while in a vertical position. Typically, the wafer 130 sits on a pair of rollers of the scrubber 100c. The brushes 120 are configured to rotate in a desired direction such that both sides of the wafer 130 are evenly scrubbed, using an equal and opposite pressure on each side of the wafer 130. For more information on vertical wafer scrubbing, reference may be made to U.S. Pat. No. 5,875,507, having inventors Stephens et al., entitled "Wafer Cleaning Apparatus," which is hereby incorporated reference.

Figure 3:
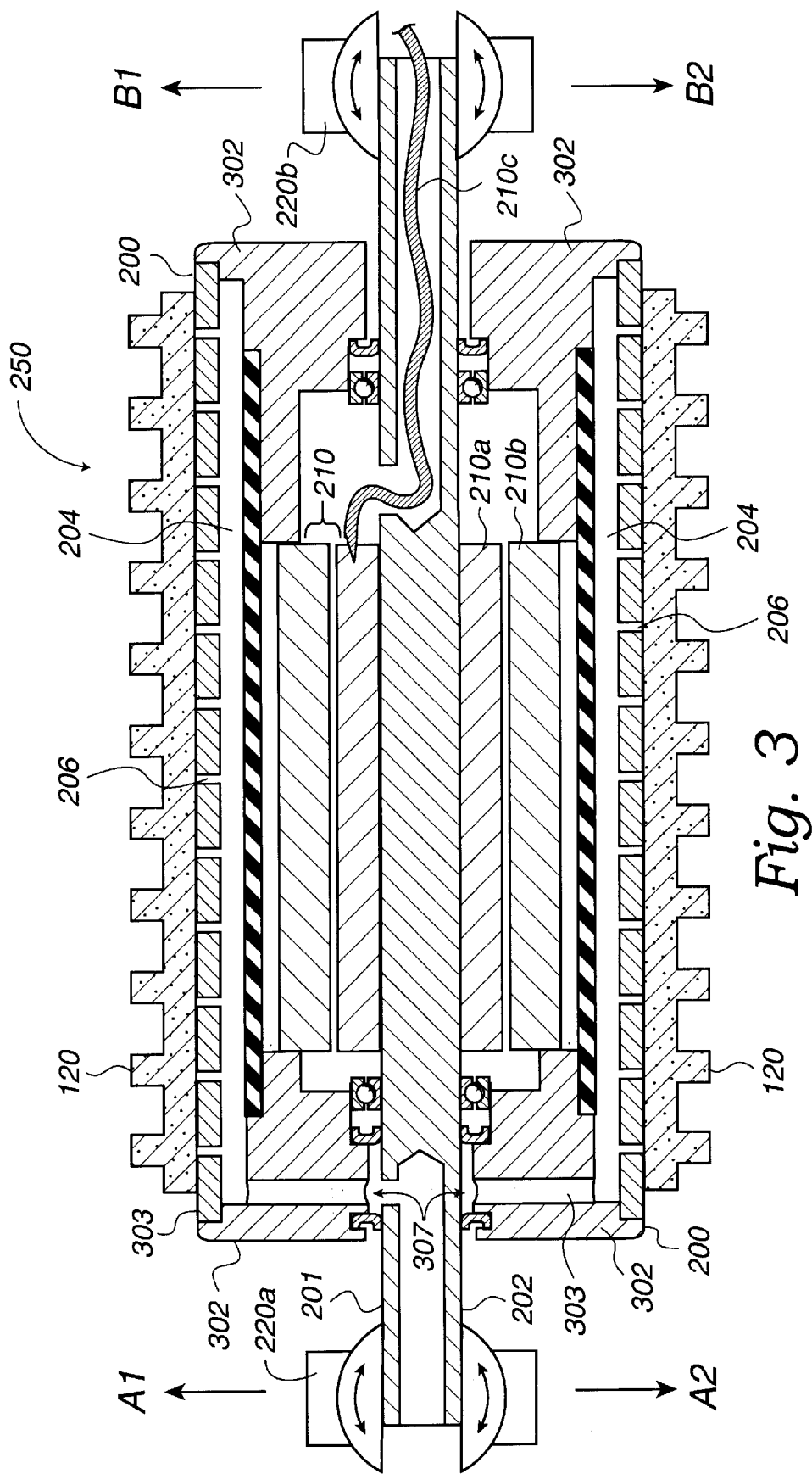
FIG. 3 is a cross-sectional view of a brush core having an internal motor, in accordance with one embodiment of the present invention.

FIG. 3 is a cross-sectional view 250 of a brush core 200 having an internal motor 210, in accordance with one embodiment of the present invention. The brush core 200 has a shaft 201 through each end of the brush core 200, and at one end the shaft 201 with a fluid inlet 202 is defined to enable the supply of preparation fluids into the brush core 200. At each end, the shaft 201 is connected to a respective position controls 220a and 220b. Each of the position controls 220a and 220b are configured to be independently controlled in respective directions A1, A2, B1, and B2. In one embodiment, the position controls 220 can be manually adjusted (i.e., using mechanical adjustments), or controlled by way of the control station 102. In another embodiment, the control station 102 can either be user programmed or can be automatically adjusted depending upon various conditions. For example, if the wafer is inserted or enters between the brushes in a slight skewed orientation, the control station 102 using sensors can detect the skewed orientation and make appropriate adjustments to the position controls 220. In other embodiments, if the brush core 200 is implemented in buffing, the position controls 220 can be programmed to apply more or less pressure to different sides of a wafer.

It is therefore important to note that because the drive train and motor are no longer external to the brush core 200 (as shown in FIG. 1A), it is possible to precision control the position of each end of the brush core 200. That is, if the drive train and motor were external as in the prior art, at least one end of the brush would have to remain relatively fixed to prevent improper drive drain engagement and/or torque application.

Continuing with the description of the brush core 200, because a motor 210 is contained within the brush core 200, a distribution channel 204 is defined near the external diameter and proximate to the brush 120. Holes 206 are arranged throughout the brush core surface defining a path from the distribution channel 204 to the brush 120. Because the cleanliness of a brush core 200 is of great importance in substrate preparation, such as wafer cleaning, etching, and buffing, the motor 210 should be configured to be as clean as possible, and be properly sealed within the brush core 200. In one embodiment, the brush core 200 will include an encasing structure that will seal and isolate the moving parts of the motor 210 from the preparation fluids provided to the fluid inlet 202, the shaft 201, and the brush 120. In this manner, a preparation station implementing the brush core 200 can maintain the desired level of clean room specification, such as class-1.

The motor 210 will preferably have a self-contained drive train that will enable rotation of the brush core 200 during operation. In this example, the shaft 201 is defined as a single shaft that extends from one end of the brush to the other. The motor 210, in one exemplary embodiment can have a field 210a, an armature 210b, and associated wires 210c. The wires 210c are preferably fed through the shaft 201 at the opposite end of the fluid inlet 202. Although additional details of the brush core 200 will be discussed with reference to FIG. 5 below, it should be appreciated that the motor 210 will cause the brush core 200 to rotate around the shaft 201. That is, the shaft is non-rotating, and therefore, each end of the shaft 201 can be fixed to the position controls 220a and 220b. An exemplary motor may be a modified version of an OOTL Series Motorized Conveyor Belt Pulley motor manufactured by Interroll Corporation of Wilmington, N.C. Of course, any other motor can be used so long as it is designed to fit within the brush core 200, it meets the desired cleanliness specification, and can provide the desired torque to operate in high precision substrate preparation systems. It should also be apparent to those skilled in the art that because the drive train is preferably inside the brush core 200, much less transmission loss will occur, thus improving the motor's efficiency.

Figure 4:
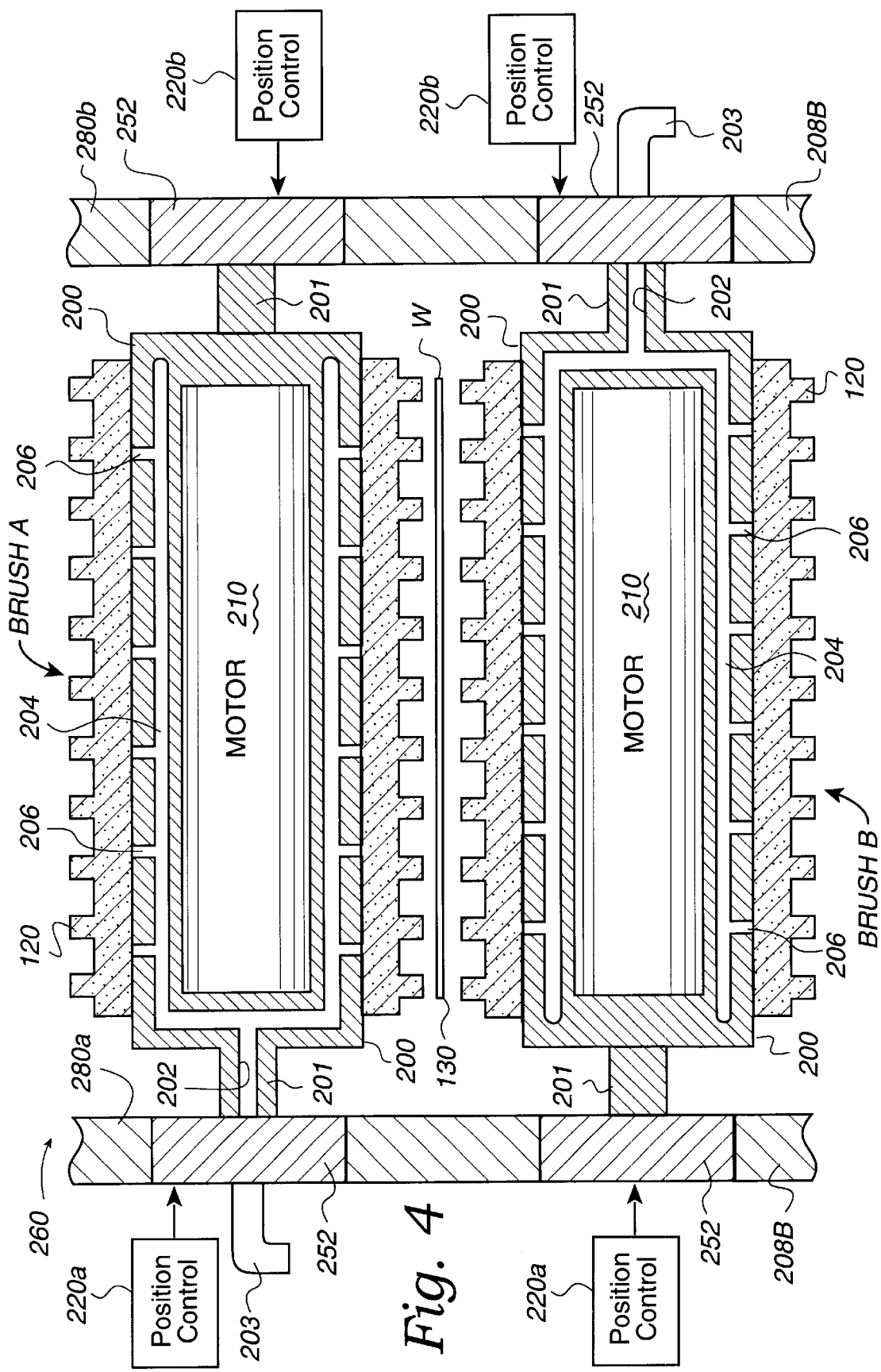
FIG. 4 is a cross-sectional view of a wafer preparation system having a pair of brushes that implement the brush core of FIG. 3, in accordance with one embodiment of the present invention.

FIG. 4 is a cross-sectional view of a wafer preparation system 260 having a pair of brushes that implement the brush core 920, in accordance with one embodiment of the present invention. In this example, a BRUSH A and a BRUSH B are positioned such that a wafer 130 can be positioned and scrubbed between brushes 120. Because the motor 210 and its associated drive train are contained within each of the brush cores 200, the resulting footprint of the wafer preparation system 260 can be reduced. This is a significant advantage due to the high cost of clean room space. Also shown are position blocks 252 which can be, in one example, contained within respective walls 280a and 280b. Of course, the position blocks 252 can also be placed within the walls 280 or outside the walls 280. The position blocks 252 are thus controllably adjusted by way of respective position controls 220a and 220b.

As will be appreciated by those skilled in the art, this cross-sectional view can represent both the orientation in a horizontal wafer scrubber 100b and a vertical wafer scrubber 100c. Besides being able to controllably position and calibrate both ends of the brushes to account, for example, to some known or detected skew of an incoming wafer or substrate, the brushes can also be position off-center to accomplish precision controlled buffing. This type of precision control therefore allows for the application of differential pressure on the surface of the substrate being prepared. In buffing implementations, the position controls 220 can move the position blocks 252 in three dimensions (e.g., in an X, Y, and Z dimension). The actual positioning of the brushes, of course, will depend upon the desired preparation operation being performed. This type of controlled position would not be possible if the ends of the brush were fixed relative to mechanically arranged drive train gears and motors as is the case in the prior art.

Figure 5:
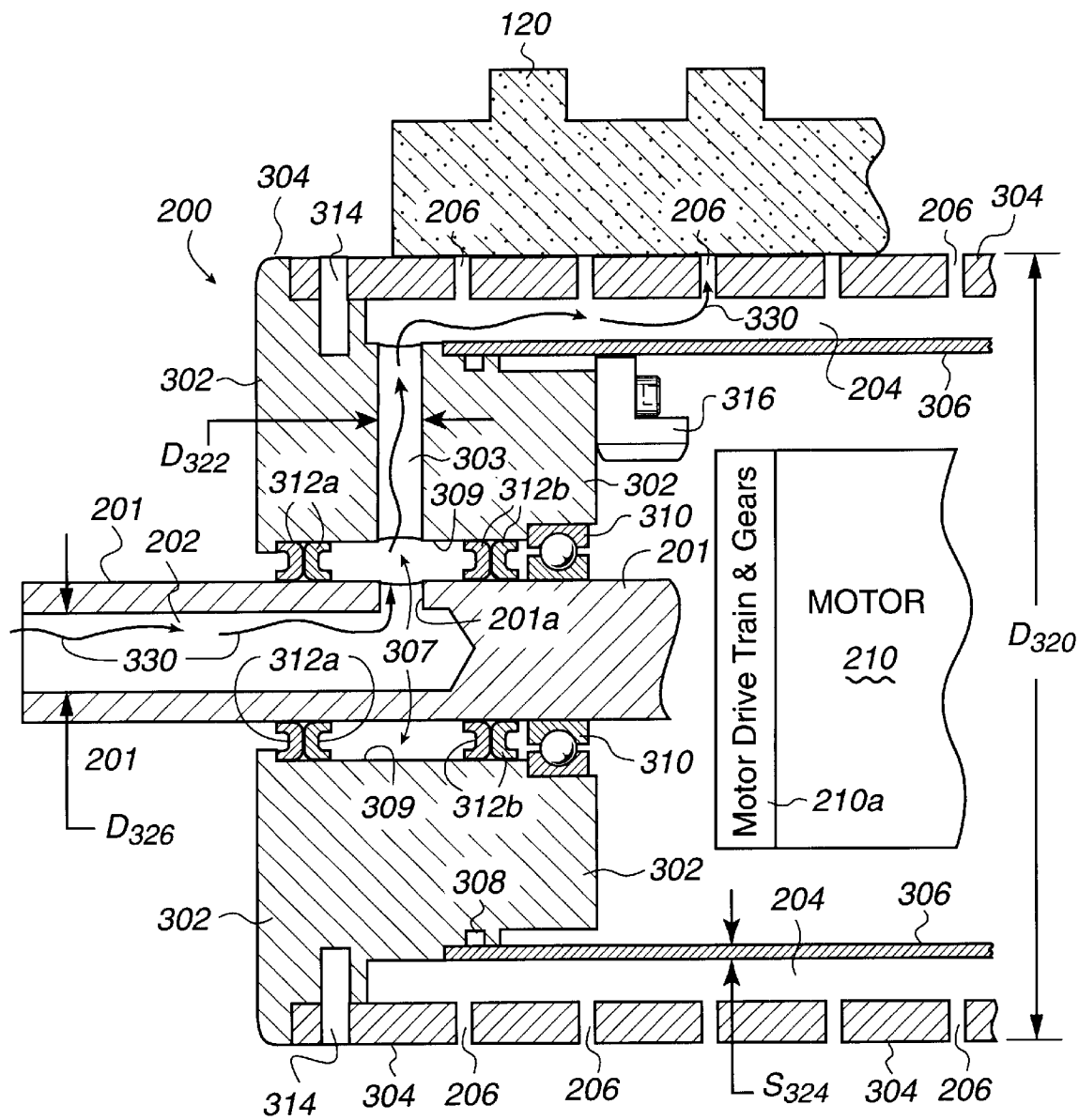
FIG. 5 illustrates a partial cross-sectional view of the brush core of FIGS. 3 and 4, in accordance with one embodiment of the present invention.

FIG. 5 illustrates al partial cross-sectional view of the brush core 200, in accordance with one embodiment of the present invention. In this exemplary embodiment, the brush core 200 has an internal motor case 306 which is designed to contain the motor 210. The internal motor case 306 is preferably made of a material that is strong even when manufactured to thin dimensions. In one embodiment, the internal motor case 306 is designed in the shape of a cylinder, and is made from a hastelloy material. As is well known, hastelloy materials are strong and are able to withstand any heat generated by the motor 210. In another embodiment, the internal motor case 306 can also be a hastelloy cylinder coated with polyethylene terephthalate (PET). PET materials are known for their high purity and are relatively easy to machine. Thus, PET materials are highly desirable for use in substrate preparation equipment that require very clean conditions, such as class-1. In this example, the PET material should be designed to coat the outer surface of the hastelloy motor case 306, such that the PET defines a wall of the distribution channel 204.

The distribution channel 204 is further defined by the cylindrical brush core shell 304, which has a plurality of holes 206 defined therein. The plurality of holes 206 thus define paths to the distribution channel 204 to enable a fluid flow 330 to be evenly applied to the brush 120. In one embodiment, the separation $S_{324}$ between the internal motor case 306 and the brush core shell 304 ranges between about 1/32 inch and about 1/8 inch. Of course, this dimension can vary so long as a good level of distribution is achieved. Also, the brush core shell 304 is preferably made of a PET material. This selection is due to the ease of manufacture and the desired clean nature of the brush core 200. In addition, PET materials are also well suited to withstand direct interaction with different types of preparation fluids which may be applied to the brush core 200 through the fluid inlet 202. For instance, in some cleaning and etching operations, the fluids may be mixtures containing acid. Such acids include, for example, hydrofluoric acid (HF) of varying concentrations.

At one end of the brush core 200, the shaft 201 includes the fluid inlet 202 that provides the fluid flow 330 into the distribution channel 204. To ensure a high level of purity for all surfaces that come in contact with the fluid flow 330, at least the shaft 201 that encloses the fluid inlet 202 is made of a PET material. In this embodiment, the fluid inlet 202 has a diameter $D_{326}$ ranging between about 3/16 inch and about 3/8 inch, and more preferably is about 1/4 inch. The diameter should be selected to ensure that a sufficient amount of fluid flow 330 pressure is supplied to the brush core 200. Preferably, the pressure is selected to be between about 5 and 30 PSI, and most preferably about 15 PSI. Of course, these dimensions will change depending upon the size of the substrate being prepared. The substrate may be, for example, a 200 mm wafer, a 300 mm wafer, etc. The shaft 201 will have a plurality of holes 201a that feed passages 303. The passages 303 are defined in a motor end cap 302. The motor end cap 302 is preferably made from a PET material and is designed to seal and couple to the motor 210. That is, once the motor 210 is inserted into the motor case 306, the motor end cap 302 which includes one or more gears 316 will engage an appropriate ring gear of the motor 210. Also, once the motor end cap 302 is inserted, an O-ring 308 will seal a surface interface between the internal motor case 306 and the motor end cap 302. As shown in FIG. 3 above, the brush core 200 preferably also has a second motor end cap 302 at the end opposite the fluid inlet 202. To power the motor, wires are fed through the shaft 201 as shown in FIG. 3. In one embodiment, the wires are Teflon encapsulated. Additionally, this same end can be used to ventilate the motor during operation. One or more pins 314 can also be used to secure the brush core shell 304 to the motor end caps 302.

In one embodiment, the motor 210 can include a primary gear and a ring gear (not shown) that engage with the gears 316. The gears 316 are thus fixed to the motor end cap 302 as shown in FIG. 5. When the motor rotates internally within the brush core 200, the motor 210 will cause the motor end cap 302 to rotate, thus rotating the entire brush core 200 and brush 120 around the shaft 201. As described above, the shaft 201 is preferably non-rotating, but the brush core 200 will rotate around the shaft 201. The fact that the shaft 201 is non-rotating will therefore enable precision control, movement and/or adjustment of each end of the shaft 201. Preferably, the motor 210 will have an internal motor drive train and gears 210a.

As shown, the motor end caps 302 are connected to the shaft 201 by way of suitable bearings 310 and seals 312. The motor end cap 302 has a bore 309 defined therein to receive the shaft 201. The seals 312 are designed to be high purity seals, preferably made from a PET material, a polypropylene material, a graphite material or a Teflon material. For instance, two pairs of seals 312a and 312b are arranged between the shaft 201 and the end cap 302. A separation between the seals 312a and 312b therefore defines a path that is a high purity path leading from the fluid inlet 202, into the passage 303 and into the fluid distribution channel 204. The passage 303 can have any suitable diameter $D_{322}$ which provides good distribution from the fluid inlet 202 and into the fluid distribution channel 204. Also, as described above, one or more passages 303 may be provided. Although the specific dimensions can be varied for different size substrates, the diameter $D_{320}$ of the brush core 200 will preferably range between about 1 inch and about 3 inches, and most preferably is about 1.5 inches for a 300 mm wafer.

It is again noted that the brush core of the present invention can be modified for use in scrubbing any number of substrate types, for example, semiconductor wafers, hard drive disks, flat panel displays, and the like. Additionally, the brush core can be modified for substrate scrubbing applications of any size, for example, 100 mm wafers, 200 mm wafers, 300 mm wafers, smaller wafers, larger wafers, hard drive disks of different sizes and materials, etc. It should also be noted that any number of fluids can be delivered through the brush (TTB), for example, DI water, ammonia containing chemical mixtures, HF containing chemical mixtures, surfactant containing chemical mixtures, and many other variations. The brush core of the present invention can also be wrapped with special material to enable wafer polishing and buffing.

For more information on wafer scrubbing brush technology, reference can be made to U.S. Pat. No. 5,806,126, having inventors de Larios et al., entitled "Apparatus For A Brush Assembly," and U.S. patent application Ser. No. 09/112,666, now U.S. Pat. No. 6,247,197, having inventors Vail et al., entitled "Brush Interflow Distributor." These U.S. Patents are hereby incorporated by reference.

For additional information on wafer preparing systems and techniques, reference may be made to commonly owned U.S. patent application numbers: (1) 08/792,093, filed Jan. 31, 1997, now U.S. Pat. No. 5,858,109, entitled "Method And Apparatus For Cleaning Of Semiconductor Substrates Using Standard Clean 1 (SC1)," (2) 08/542,531, filed Oct. 13, 1995, now abandoned, entitled "Method and Apparatus for Chemical Delivery Through the Brush," and (3) 09/277,712, filed Mar. 26, 1999, now U.S. Pat. No. 6,247,903 entitled "Pressure Fluctuation Dampening System." All three U.S. patent applications are hereby incorporated by reference.

Although the foregoing invention has been described in some detail for purposes of clarity of understanding, it will be apparent that certain changes and modifications may be practiced within the scope of the appended claims. For example, the materials used to manufacture the brush core can be substituted for other materials that maintain the high level of purity. For example, instead of PET, other materials may include Teflon, polypropylene, kynar, and the like. Accordingly, the present embodiments are to be considered as illustrative and not restrictive, and the invention is not to be limited to the details given herein, but may be modified within the scope and equivalents of the appended claims.

What is claimed is:

1. A brush core for use in substrate preparation, comprising:
   a cylindrical inner motor case having a first diameter;
   a cylindrical brush core shell having a second diameter that is greater than the first diameter, a separation between the first diameter and the second diameter defining a fluid distribution channel;
   a motor contained within the cylindrical inner motor case;
   motor end caps being configured to contain the motor within the cylindrical inner motor case;
   a bore defined in the motor end caps; and
   a shaft positioned through the motor end caps and the motor, the shaft having a fluid inlet for providing a fluid to the fluid distribution channel.

2. A brush core for use in substrate preparation as recited in claim 1, wherein one of the motor end caps has a plurality of passages that define a fluid path between the fluid inlet of the shaft to the fluid distribution channel.

3. A brush core for use in substrate preparation as recited in claim 1, wherein the cylindrical brush core shell has a plurality of holes to enable passage of fluid out of the fluid distribution channel.

4. A brush core for use in substrate preparation as recited in claim 1, wherein the cylindrical inner motor case is made from one of a hastelloy material and a PET coated hastelloy material, and the cylindrical brush core shell, and the motor end cap are made from a PET material.

5. A brush core for use in substrate preparation as recited in claim 1, further comprising:
   a first position control for controlling a position of a first end of the shaft; and
   a second position control for controlling a position of a second end of the shaft.

6. A brush core for use in substrate preparation as recited in claim 5, wherein the position of the first end and the position of the second end are configured to be adjusted to apply controlled pressure or correct brush core skew during substrate preparation.

7. A brush core for use in substrate preparation as recited in claim 6, wherein substrate preparation includes one of wafer scrubbing, wafer etching, wafer buffing, wafer cleaning, and hard disk cleaning.

8. A brush core, comprising:
   a plurality of holes defined around a surface of the brush core, the plurality of holes designed for delivery of substrate preparation fluids;
   a shaft having a first end and a second end;
   a motor for rotating the brush core, the motor being positioned around the shaft; and
   a cylindrical inner motor case for containing the motor, the cylindrical inner motor case having a diameter that is less than a diameter of the brush core so as to define a separation for distributing the substrate preparation fluids that are to be delivered through the plurality of holes;
   wherein the first end and the second end of the shaft are each capable of being adjusted to calibrate and position the brush core.

9. A brush core of claim 8, wherein the shaft is a non-rotating shaft and the brush core is configured to rotate about the non-rotating shaft.

10. A brush core as recited in claim 8, wherein the brush core further comprises:
    a cylindrical brush core shell contains a cylindrical internal motor case, a fluid distribution channel being defined between the cylindrical brush core shell and the cylindrical internal motor case.

11. A brush core as recited in claim 10, wherein the brush core further comprises:
    motor end caps for sealing the motor within the cylindrical internal motor case, one of the motor end caps having at least one gear for engaging gears of the motor, the engaged gears of the motor and the at least one gear being configured to enable the rotation of the brush core.

12. A brush core as recited in claim 11, wherein the cylindrical inner motor case is made from one of a hastelloy material and a PET coated hastelloy material, and the cylindrical brush core shell, and the motor end caps are made from a PET material.

13. A brush core as recited in claim 10, wherein the cylindrical brush core shell has a plurality of holes for channeling a fluid out of the fluid distribution channel.

14. A brush core, comprising:
    a plurality of holes defined around a surface of the brush core, the plurality of holes designed for delivery of fluids;

a non-rotating shaft having a first end and a second end;

a motor contained within the core for rotating the core about the non-rotating shaft;

a first and second position block, each of the first and second position blocks being coupled to each of the first end and the second end, respectively, and the first and second position blocks coupled to walls of a housing, wherein the first end and the second end are each capable of being adjusted using the first and second position blocks to calibrate a position of the core, the position of the core being adjusted relative to a substrate surface that is to be prepared.

15. A core of claim 14, wherein the core is used in wafer preparation.

16. A brush core, comprising:

a shaft having a first end and a second end;

a motor contained within the brush core for rotating the brush core;

wherein the first end and the second end of the shaft are each capable of being adjusted to calibrate and position the brush core; and a cylindrical brush core shell contains a cylindrical internal motor case, a fluid distribution channel being defined between the cylindrical brush core shell and the cylindrical internal motor case.

* * * * *